United States Patent
Engelmann et al.

(10) Patent No.: US 9,881,793 B2
(45) Date of Patent: Jan. 30, 2018

(54) NEUTRAL HARD MASK AND ITS APPLICATION TO GRAPHOEPITAXY-BASED DIRECTED SELF-ASSEMBLY (DSA) PATTERNING

(71) Applicant: International Business Machines Corporation, Armonk, NY (US)

(72) Inventors: Sebastian U. Engelmann, White Plains, NY (US); Mahmoud Khojasteh, Poughkeepsie, NY (US); Deborah A. Neumayer, Danbury, CT (US); John Papalia, New York, NY (US); Hsinyu Tsai, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 14/806,921

(22) Filed: Jul. 23, 2015

(65) Prior Publication Data

US 2017/0025274 A1  Jan. 26, 2017

(51) Int. Cl.
- *B44C 1/22* (2006.01)
- *H01L 21/033* (2006.01)
- *B81C 1/00* (2006.01)
- *G03F 7/09* (2006.01)
- *G03F 7/00* (2006.01)

(52) U.S. Cl.
CPC ...... *H01L 21/0337* (2013.01); *B81C 1/00396* (2013.01); *G03F 7/0002* (2013.01); *G03F 7/094* (2013.01)

(58) Field of Classification Search
CPC ......... B81C 1/00396; B81C 2201/0156; G03F 7/0002; G03F 7/094; H01L 21/0337
USPC ........................................ 216/42, 47, 48, 49
See application file for complete search history.

(56) References Cited

U.S. PATENT DOCUMENTS

| 7,767,099 | B2 | 8/2010 | Li et al. |
| 8,137,893 | B2 | 3/2012 | Burns et al. |
| 8,715,971 | B2 | 5/2014 | Holmes et al. |
| 8,853,085 | B1 | 10/2014 | Abdallah et al. |
| 8,894,869 | B2 | 11/2014 | Chang et al. |
| 2012/0067843 | A1 | 3/2012 | Watanabe et al. |
| 2014/0169102 | A1 | 6/2014 | Sun et al. |

(Continued)

FOREIGN PATENT DOCUMENTS

| CN | 103177936 A | 6/2013 |
| WO | WO2013156240 A1 | 10/2013 |
| WO | WO2014169102 A1 | 10/2014 |

*Primary Examiner* — Binh X Tran
(74) *Attorney, Agent, or Firm* — Scully, Scott, Murphy & Presser, P.C.; Louis J. Percello, Esq.

(57) ABSTRACT

A material stack is formed on the surface of a semiconductor substrate. The top layer of the material stack comprises at least an organic planarization layer. A neutral hard mask layer is formed on the top of the organic planarization layer. The neutral hard mask layer is neutral to the block copolymers used for direct self-assembly. A plurality of template etch stacks are then formed on top of the neutral hard mask layer. After formation of the template etch stacks, neutrality recovery is performed on the neutral hard mask layer and the top portions of the template etch stacks, the vertical sidewalls of the template etch stacks being substantially unaffected by the neutrality recovery. A template for DSA is thus obtained.

19 Claims, 3 Drawing Sheets

(56) References Cited

U.S. PATENT DOCUMENTS

| | | |
|---|---|---|
| 2014/0273511 A1 | 9/2014 | Farrell et al. |
| 2014/0287587 A1 | 9/2014 | Lee et al. |
| 2014/0322917 A1 | 10/2014 | Abdallah et al. |
| 2014/0346142 A1 | 11/2014 | Chapuis et al. |
| 2015/0227046 A1* | 8/2015 | Park .................. G03F 7/168 430/315 |
| 2015/0243525 A1* | 8/2015 | Park .................. H01L 21/31144 438/703 |
| 2015/0367379 A1* | 12/2015 | Lo .................. G03F 7/0002 428/201 |
| 2016/0266486 A1* | 9/2016 | Wuister .............. G03F 7/0002 |
| 2016/0379837 A1* | 12/2016 | Cheng .............. C09D 201/00 438/781 |

* cited by examiner

NEUTRAL HARD MASK AND ITS APPLICATION TO GRAPHOEPITAXY-BASED DIRECTED SELF-ASSEMBLY (DSA) PATTERNING

BACKGROUND

The present application relates to semiconductor processing; more particularly, to a method of forming a template for the directed self-assembly (DSA) of block copolymers (BCPs) especially in the context of graphoepitaxcy DSA.

Directed self-assembly refers to the integration of block copolymer materials that undergo phase or domain separation with traditional semiconductor manufacturing processes. With DSA, nanoscale dimensions are achievable with dramatically reduced cost using novel material designs without the need for additional equipment upgrades. In order to form vertically oriented line-space patterns with block copolymer domains, a neutral layer must be present at the bottom of the block copolymer layer.

Whereas in DSA the sidewalls of the vertically oriented line-space pattern must have a preference for one polymer block over the other, e.g. via surface chemistry, in order to provide the impetus to properly align the DSA lines, the neutral layer should not. That is, the neutral layer must not show a strong wetting affinity for one of the polymer blocks over the other. The matter of neutrality is further complicated in graphoepitaxy uses inasmuch as the neutral layer must remain neutral after any processing prior to directed self-assembly, e.g. resist development and etch. Moreover, the neutral layer must be stable and remain neutral for a range of thicknesses and deposition conditions. Conventional neutral layers include polymers that graft onto the hard mask portion of the assembly, and include layers of cross-linked polymers. Other materials such as a silicon-containing antireflection film (SiARC) and a chemical vapor deposition (CVD) carbon film are not sufficiently neutral or stable.

There is thus a need for alternative methods for providing a neutral layer in etched template DSA graphoepitaxy processes, which layer can remain neutral or have its neutrality recovered BY any processing prior to DSA. Such a neutral layer would effectively decouple template lithography, template stack and etch processes from DSA formation; and would further provide for the use of techniques such as Extreme Ultra Violet (EUV) and etch trim processes for the patterning of DSA templates.

SUMMARY

A material stack is formed on the surface of a semiconductor substrate. The material stack comprises at least an organic planarization layer as the top layer. A neutral hard mask layer is formed on the top of the organic planarization layer. The neutral hard mask layer is neutral to the block copolymers used for direct self-assembly. A plurality of template etch stacks are then formed on top of the neutral hard mask layer. After formation of the template etch stacks, neutrality recovery is performed on the neutral hard mask layer and the top portions of the template etch stacks, the vertical sidewalls of the template etch stacks being substantially unaffected by the neutrality recovery. A template for DSA is thus obtained.

In one aspect of the present application, a method of forming a template for the directed self-assembly (DSA) of block copolymers (BCPs) is provided. In one embodiment, the method includes forming a material stack on a surface of a semiconductor substrate, the top surface of the material stack comprising an organic planarization layer. A neutral hard mask layer is then formed on top of the organic planarization layer. The neutral hard mask layer is neutral to the BCPs used for DSA. A plurality of template etch stacks is then formed on top of the neutral hard mask layer. A neutrality recovery step is then performed. The neutral hard mask layer and the top portions of the plurality of template etch stacks are selectively neutralized without altering the surface properties of the vertical sidewalls of the template etch stacks. A template for DSA is thereby obtained.

DETAILED DESCRIPTION

Figure 1:
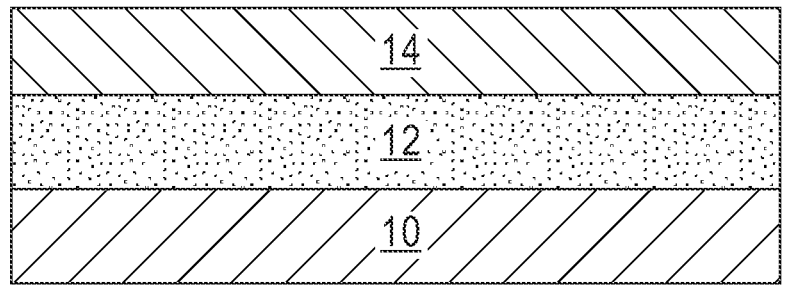
FIG. 1 is a cross sectional view of an exemplary structure including a material stack having a top optical planarization layer, the material stack located on a surface of a semiconductor substrate, the cross sectional view being after forming a neutral hard mask layer on the optical planarization layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, illustrated thereat is an exemplary semiconductor structure including material stack 12 that is disposed on a surface of semiconductor substrate 10. The material stack comprises at least a layer of an organic planarization layer, such as a carbon containing organic planarization layer. As shown in the embodiment of FIG. 1, the organic planarization layer is the only layer of the material stack and thus comprises element 12 in the proceeding description. One or more other layers as known in the art (not shown) can be included within the material stack. For example, the material stack can be a lithographic material stack comprised of, from bottom to top, an optical planarization layer (which can be the same or different material from the organic planarization layer 12), and antireflective coating, and an orientation control layer. Additional hard masks can be included within such a lithographic stack, typically between the optical planarization layer and the semiconductor substrate for etching purposes.

In some embodiments of the present application, the semiconductor substrate 10 can be a bulk semiconductor substrate. The term "bulk semiconductor substrate" denotes a substrate that is entirely composed of at least one semiconductor material. When a bulk semiconductor substrate is employed as semiconductor substrate 10, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor substrate. In one embodiment, the bulk semiconductor substrate that can provide the semiconductor substrate 10 can be comprised of a single crystalline semiconductor material, such as, for example, single crystalline silicon. In other embodiments, the bulk semiconductor substrate that can provide the semiconductor substrate 10 may comprise a polycrystalline or amorphous semiconductor material.

In embodiments of the present application in which a bulk semiconductor substrate is employed as semiconductor substrate 10, semiconductor fins can be subsequently formed into a top portion of the bulk semiconductor substrate utilizing the method of the present application.

In another embodiment, the semiconductor substrate 10 may comprise a semiconductor-on-insulator (SOI) substrate (not specifically shown). Although not specifically shown, one skilled in the art understands that an SOI substrate includes a handle substrate, an insulator layer located on an upper surface of the handle substrate, and a topmost semiconductor layer located on an upper surface of the insulator layer. The handle substrate provides mechanical support for the insulator layer and the topmost semiconductor layer. In such an embodiment, the semiconductor fins can be subsequently processed into the topmost semiconductor layer of the SOI substrate utilizing the method of the present application. In this embodiment, the semiconductor fins (to be subsequently formed) are located on a topmost surface of the insulator layer.

The handle substrate and the topmost semiconductor layer of the SOI substrate may comprise the same, or different, semiconductor material. The semiconductor material of the handle substrate and the topmost semiconductor layer can include one of the semiconductor materials mentioned above for the bulk semiconductor substrate. Multilayers of semiconductor materials can also be used as the semiconductor material of the handle substrate and the topmost semiconductor layer. In one embodiment, the handle substrate and the topmost semiconductor layer are both comprised of silicon. In some embodiments, the handle substrate is a non-semiconductor material including, for example, a dielectric material and/or a conductive material. In yet other embodiments, the handle substrate can be omitted and a substrate including the insulator layer and the topmost semiconductor layer can be used in the present application.

In some embodiments, the handle substrate and the topmost semiconductor layer of the SOI substrate may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the top semiconductor layer of the SOI substrate may be a single crystalline semiconductor material, a polycrystalline material, or an amorphous material. Typically, at least the topmost semiconductor layer is a single crystalline semiconductor material. In some embodiments, the topmost semiconductor layer that is located atop the insulator layer can be processed to include semiconductor regions having different crystal orientations.

The insulator layer of the SOI substrate may be a crystalline or non-crystalline oxide or nitride. In one embodiment, the insulator layer is an oxide such as, for example, silicon dioxide. The insulator layer may be continuous or it may be discontinuous. When a discontinuous insulator region is present, the insulator region can exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the topmost semiconductor layer to a layer having a thickness that is more desirable.

In one example, the thickness of the topmost semiconductor layer of the SOI substrate can be from 10 nm to 100 nm. In some embodiments, and when an ETSOI (extremely thin semiconductor-on-insulator) substrate is employed, the topmost semiconductor layer of the SOI has a thickness of less than 10 nm. If the thickness of the topmost semiconductor layer is not within one of the above mentioned ranges, a thinning step such as, for example, planarization or etching can be used to reduce the thickness of the topmost semiconductor layer to a value within one of the ranges mentioned above. The insulator layer of the SOI substrate typically has a thickness from 1 nm to 200 nm, with a thickness from 100 nm to 150 nm being more typical. The thickness of the handle substrate of the SOI substrate is inconsequential to the present application.

In FIG. 1, the material stack comprising organic planarization layer 12 that can be employed in the present application comprises an organic material including C, O, and H, and optionally includes Si and/or F. In one embodiment, organic planarization layer 12 comprises a carbon-containing polymer which can be spun on. In a further example, diamond-like carbon can be used as the material of the organic planarization layer 12. The organic planarization layer 12 can be formed by spin-on coating, chemical vapor deposition, plasma enhanced chemical vapor deposition, evaporation or chemical solution deposition. The thickness of the organic planarization layer 12 can be from 10 nm to 300 nm, although lesser and greater thicknesses can also be employed.

Neutral hard mask layer 14 is a material that is neutral to the block copolymers used for direct self-assembly. That is, the neutral hard mask layer is comprised of a material that does not show a strong wetting affinity for one of the polymer blocks over the other. In one embodiment, neutral hard mask layer 14 is comprised of a nitrogen doped silicon carbide or nitrogen doped hydrogenated silicon carbide layer. Nitrogen doped silicon carbide is a compound of silicon, carbon and nitrogen, denoted e.g. as SiCN. Nitrogen doped hydrogenated silicon carbide is a compound of silicon, carbon, nitrogen and hydrogen, denoted e.g. as SIC(N, H). An exemplary nitrogen doped silicon carbide or nitrogen doped hydrogenated silicon carbide is NBloK™, Applied Materials, Santa Clara, Calif. In one embodiment, the neutral hard mask layer 14 is NBloK and is formed on top of organic planarization layer 12 by a plasma-enhanced chemical vapor deposition (PECVD) process at e.g. 200° C. The thickness of the neutral hard mask layer 14 can be from 10 nm to 300 mn, including in some embodiments 20 mn to 60 nm, although lesser and greater thicknesses can also be employed.

In embodiments wherein the material stack further comprises an antireflective coating, such antireflective coatings comprises any material that can reduce image distortions associated with reflections off the surface of semiconductor substrate 10. In one example, the antireflective coating is a silicon (Si)-containing antireflective coating material. The antireflective coating can be formed by spin-on coating, chemical vapor deposition, plasma enhanced chemical vapor deposition, atomic layer deposition (ALD), plasma-enhanced ALD, evaporation or chemical solution deposition. The thickness of the antireflective coating 14 can be from 10 nm to 150 nm, although lesser and greater thicknesses can also be employed.

In embodiments wherein the material stack further comprises an orientation control layer, such orientation control layer can be a polymer layer that can adhere to an underlying surface and achieve a certain desired surface energy. The orientation control layer is typically a random copolymer that contains a polar polymeric component and a non-polar polymeric component; the random copolymer that can be used in providing the orientation control layer may have the same or different polymeric components as defined below for the copolymer layer that provides the self-assembled block copolymer structure. By "random" it is meant a polymeric material wherein the repeating units are defined, or usually defined, but the occurring order of the unit block in the polymer is random. In one example, the orientation control layer may comprise a random copolymer of poly (methyl methacrylate) (i.e., PMMA) as the polar polymeric component, and polystyrene (PS) as the non-polar polymeric component. By controlling the ratio of non-polar polymeric component (i.e., PS) to polar polymeric component (i.e., PMMA) in the synthesis stage, one can achieve a desired surface property. In some embodiments, and to anchor the random copolymer to the underlying surface of the antireflective coating, if present, one or several functional groups can be added to the end of the polymer chain or in a random position of the polymer chain to react with the antireflective coating and create covalent bonding. Cross linkers such as, for example, azide ($N_3$), benzocyclobutane (BCB), and glycidyl methacrylate (GMA) can also be used to improve adhesion to the antireflective coating, if present, because of the polymer network after cross linking. The orientation control layer can be formed by spin-on coating, evaporation or chemical solution deposition. The thickness of the orientation control layer can be from 2 nm to 20 nm, although lesser and greater thicknesses can also be employed.

Figure 2:
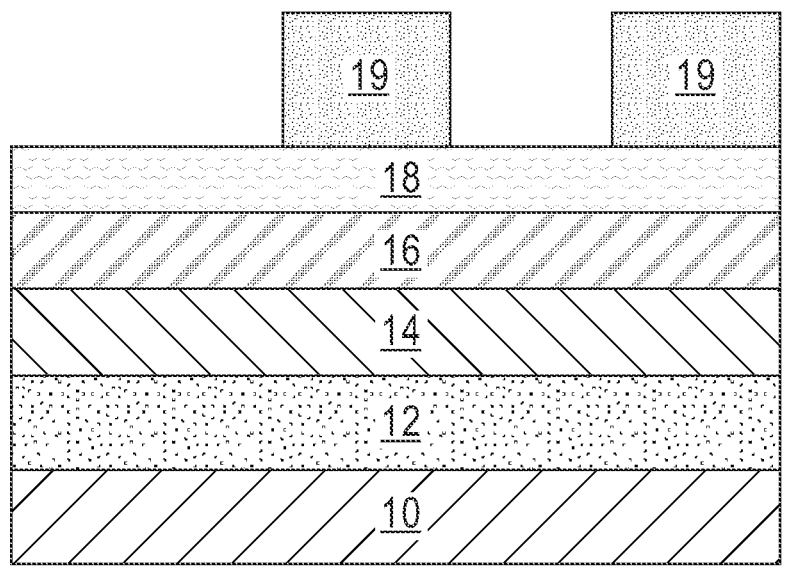
FIG. 2 is a cross sectional view of the exemplary structure of FIG. 1 showing an embodiment of a tri-layer mask pattern used to form a plurality of template etch stacks.

Referring to FIG. 2, illustrated thereat is the exemplary structure of FIG. 1 showing an embodiment of a tri-layer lithographic stack formed on top of the neutral hard mask layer 14. In the embodiment shown, the tri-layer lithographic stack is comprised of a resist layer 19, e.g. comprising an e-beam resist or a hardened photoresist, and in other embodiments the tri-layer lithographic stack additionally comprises an optical planarization layer 16, and an antireflective coating 18, as known in the art. The resist layer 19 comprises one or more resists suitable for etching by, e.g. Extreme Ultraviolet (EUV) lithography or direct lithography, e.g. e-beam exposed hydrogen silsesquioxane (HSQ).

By "e-beam resist" it is meant a molecular or polymeric material that can be patterned by e-beam lithography. Examples of e-beam resists that can be used in the present application include HSQ or methyl silsesquioxane (MSQ). The e-beam resist may include one of the cross linkers mentioned above for the orientation control layer. When e-beam resists are used, the e-beam resists are formed by first providing a blanket layer of e-beam resist material. The blanket layer of e-beam resist material can be formed a deposition process such as, for example, spin-on coating or chemical solution deposition. The thickness of the blanket layer of e-beam resist material can be from 20 nm to 250 nm, although lesser and greater thicknesses can also be employed. The blanket layer of e-beam resist is then patterned by e-beam lithography.

Photoresist includes "hardened photoresist" by is meant a photoresist material that has been actinically or chemically altered or "de-protected" or "polarity switched" including circumstances where it is no longer soluble in its original casting solvent. In another practice the photoresist is one where the remaining resist portion is not the hardened part of the photoresist, e.g. in a positive tone resist, where the polarity switched portion is removed so the remaining resist is still soluble in its original casting solvent. The photoresist material that may be employed in the present application includes a positive-tone photoresist material or a negative-tone photoresist material. The photoresist material can be formed utilizing a deposition process such as, for example, spin-on coating or chemical solution deposition. The thickness of the blanket layer of photoresist material can be from 50 nm to 250 nm, although lesser and greater thicknesses can also be employed. The blanket layer of photoresist material is then patterned by lithography. Lithography includes exposing the blanket layer of photoresist material to a desired pattern of irradiation and then developing the photoresist material utilizing a conventional resist developer.

Next, and in one embodiment in which a hardening agent is chosen to be used for resist hardening, the hardening agent is applied to each patterned photoresist portion. The hardening agent can be applied utilizing spin-coating, spray coating, dip coating, brush coating or other like coating methods. Examples of hardening agents that can be used in the present application include conventional thermal acid generators such as, for example, the polymer structures described at col. 6, lines 38-64 of U.S. Pat. No. 8,137,893 B2 to Burns et al., the entire content of which is incorporated herein by reference. Next, each patterned photoresist portion including the hardening agent is subjected to a baking process which modifies the photoresist material to be insoluble in the casting solvent of the photoresist and the block copolymer (BCP). During the baking process, acid is released from the hardening agent and a deprotection reaction occurs. In one embodiment of the present application, the baking process can be performed at a temperature from 100° C. to 160° C. Other temperatures that are lesser than, or greater than, the aforementioned temperature range can be used as long as the temperature of the baking process provides the acid releasing from the acidic polymer coating to each of the patterned photoresist portions. The baking process can be performed in air or in an inert ambient including, for example, nitrogen, helium, argon, neon, or mixtures thereof. The baking process can be performed for a time period from 30 seconds to 5 minutes. Other times can also be used for the baking process. A rinse step in solvent follows the baking step in order to remove the acidic polymer coating and leaves the modified photoresist on the surface. In some embodiments of the present application, an optional second baking process may be performed after the rinsing step. The conditions (temperature, time and ambient)

mentioned for the first baking process can also be used for the second baking process. The hardened photoresists that can be used are soluble in an aqueous developer.

Figure 3:
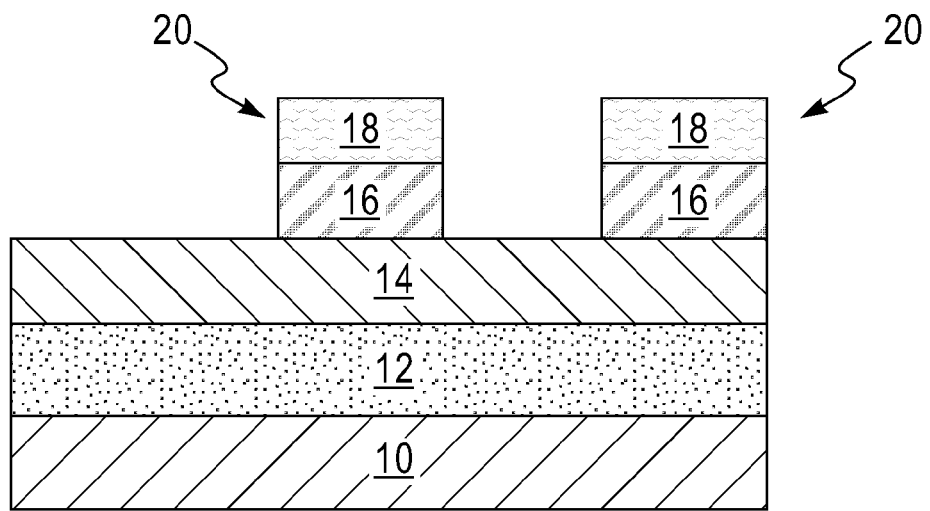
FIG. 3 is a cross sectional view of the exemplary structure of FIG. 2 showing a plurality of template etch stacks formed on top of the neutral hard mask layer after processing the tri-layer mask pattern.

Referring to FIG. 3, illustrated thereat is the exemplary structure of FIG. 2 after etching to form a plurality of template etch stacks 20 on top of neutral hard mask layer 14. In the embodiment shown, stacks 20 comprise optical planarization layer 16 and antireflective coating 18, the resist layer 20 having been removed as part of the etch process. Exemplary processes to form template etch stacks include those known in the art, e.g. optical lithography, such as EUV lithography; or direct lithography, such as e-beam lithography.

Figure 4:
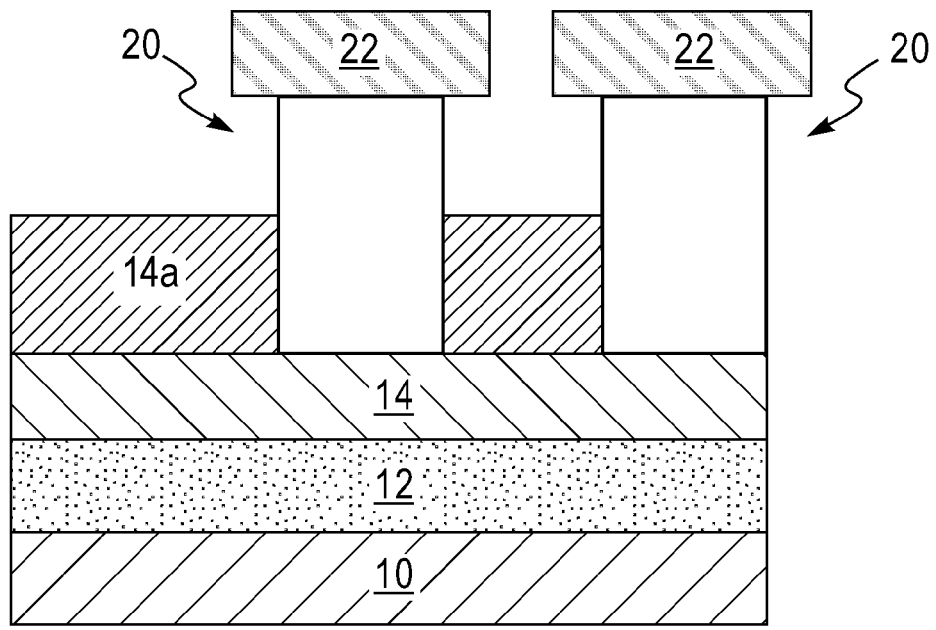
FIG. 4 is a cross sectional view of the exemplary structure of FIG. 3 after a neutrality recovering step.

Referring to FIG. 4, illustrated thereat is the exemplary structure of FIG. 3 after performance of a neutrality recovery step as an embodiment of post plasma etching that results in the plurality of template stacks in FIG. 3. In one embodiment, the neutrality recovery step comprises forming a recovery neutral hard mask layer 14a on neutral hard mask layer 14, and a recovery neutral hard mask layer 22 on the top portions of the plurality of template etch stacks 20. The recovery neutral hard mask layers 14a and 22 are neutral to the block copolymers used for direct self assembly. The recovery neutral hard mask layers 14a and 22 can comprise the same or different material from that used for neutral hard mask 14. In one embodiment, recovery neutral hard mask layers 14a and 22 are comprised of the same material as neutral hard mask, and in one embodiment they are both comprised of a nitrogen-doped silicon carbide, a nitrogen-doped hydrogenated silicon carbide, such as NBlok™, or combinations thereof. In the neutrality recovery step, the neutrality of the top surface of neutral hard mask layer 14 is recovered from effects of plasma etching, for example the top surface of neutral hard mask layer is selectively neutralized from the effects of plasma etching, whereas selectivity of the vertical sidewalls of the template etch stacks 20 for one copolymer over the other is preserved so to facilitate directed self-assembly. This enables the use of an etched template to be used for line/space graphoepitaxy and enables the decoupling of template lithography, template etch stack, and etch processes from the DSA formation process, thereby permitting the use of EUV and etch trim processes for pattern DSA templates.

Figure 5:
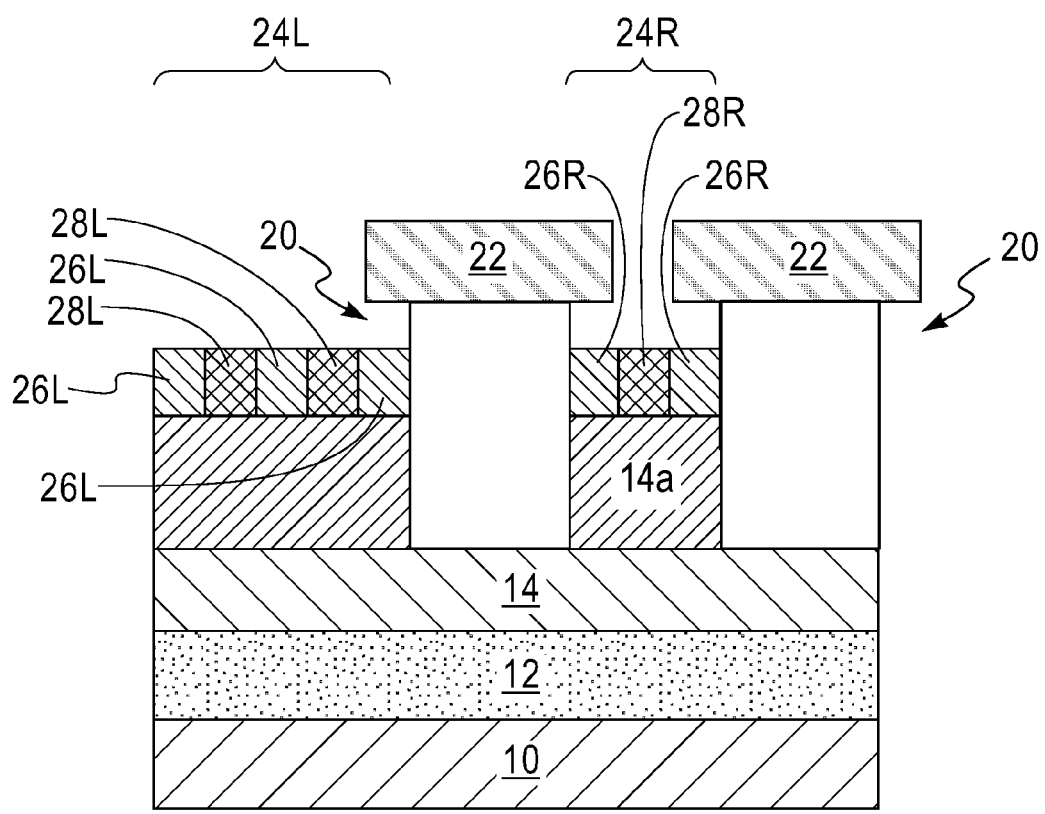
FIG. 5 is a cross sectional view of the exemplary structure of FIG. 4 after deposition of block copolymers used for direct self-assembly.

Referring to FIG. 5, illustrated thereat is the exemplary structure of FIG. 4, after forming a copolymer layer between neighboring template etch stacks 20, each stack can have the same or different widths, and then performing a directed self assembly process to provide a self assembled block copolymer structure 24L, 24R.

The self-assembled block copolymer structure 24L, 24R is located on a topmost surface of the neutral hard mask layer 14 and comprises an array of first phase separated polymeric domains 26L, 26R and an array of second phase separated polymeric domains 28L, 28R. In the embodiment shown, the topmost surface of the self-assembled block copolymer structure (24L, 24R) is located beneath a topmost surface of each template etch stack 20.

The copolymer layer can be applied between neighboring template etch stacks 20 and on a surface of the neutral hard mask layer 14, for example, by spin coating or chemical solution deposition. The copolymer material that provides the copolymer layer comprises a first polymeric block component and a second polymeric block component that are immiscible with each other. In some embodiments of the present application, the material that provides the copolymer layer may be self-planarizing. The copolymer material includes self-assembling block copolymers that are capable of self-organizing into nanometer-scale patterns. By "nanoscale patterns" it is meant features that have a size of less than 50 nm.

The copolymer layer can include a first polymer material, i.e., a first polymeric block component, and a second polymer material, i.e., a second polymeric block component. The first polymeric block component and the second polymeric block component are selected such that a self-assembly of first polymer blocks including the first polymeric block component and second polymer blocks including the second polymeric block component can be subsequently formed upon phase separation of the first and second polymeric block components. The phase separated first polymeric copolymer component is referred to as the "first phase separated polymeric domain", while the phase separated second polymeric copolymer component is referred to herein as the "second phase separated polymeric domain".

Exemplary materials for the first polymeric block component and the second polymeric block component are described in U.S. Pat. No. 7,605,081 to Yang et al., the contents of which are incorporated herein by reference. Specific examples of self-assembling block copolymers may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). In one embodiment, polystyrene-block-polymethylmethacrylate (PS-b-PMMA) is used.

The self-assembling block copolymers are first dissolved in a suitable solvent system to form a block copolymer solution, which is then applied between neighboring template etch stacks 20 and on a surface of the neutral hard mask layer 14. The solvent system used for dissolving the block copolymer and forming the block copolymer solution may include any suitable solvent, which can include, but is not limited to: toluene, propylene glycol monomethyl ether acetate (PGMEA), propylene glycol monomethyl ether (PGME), and acetone. The copolymer material is not a conventional photoresist that may be developed upon exposure to ultraviolet light or optical light. Also, the copolymer layer is not a conventional low-k dielectric material.

After forming the copolymer layer between neighboring template etch stacks 20 and on a surface of the neutral hard mask layer 14, a self-assembled block copolymer structure 24L, 24R (i.e., nanoscale self-assembled self-aligned structure) is formed between neighboring template etch stacks 20 and on a surface of the neutral hard mask layer 14 by causing phase separation of the self-assembling block copolymers through annealing. Each self-assembled block copolymer structure 24L, 24R is self-aligned to the vertical sidewalls of each template etch stack 20 and thus may be herein referred to as a "self-aligned assembly." In one embodiment, the copolymer layer can be annealed by solvent vapor annealing or by thermal annealing at an elevated temperature to form the first phase separate polymeric domains 26L, 26R including the first polymeric block component, and the second phase separate polymeric domains 28L, 28R including the second polymeric block component. The anneal may be performed, for example, at a temperature from about 180° C. to about 300° C. for a duration from 30 seconds to about 10 hours. Other anneal conditions (i.e., temperatures and times) may also be used in the present application to convert the copolymer layer into the self-assembled block copolymer structure 24L, 24R shown in FIG. 5 of the present application.

Each of the first phase separated polymeric domains 26L, 26R has a first width. Each of the second phase separated polymeric domains 28L, 28R has a second width. In some embodiments, the second width is the same as the first width. In other embodiments, the second width is different from the first width. Each of the first width and second widths are sub-lithographic, i.e., less than 50 nm.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a template for the directed self-assembly (DSA) of block copolymers (BCPs) comprising:
    forming a material stack on a surface of a semiconductor substrate, the top surface of the material stack comprising an organic planarization layer; and
    forming a neutral hard mask layer on top of the organic planarization layer, the neutral hard mask layer being neutral to the BCPs;
    forming, by an etching process, a plurality of template etch stacks on top of the neutral hard mask layer, wherein the plurality of template etch stacks expose a portion of the neutral hard mask layer;
    performing a neutrality recovery step on the neutral hard mask layer and on the top portions of the plurality of template etch stacks to obtain a template for DSA; and
    forming a self-assembled block copolymer structure between neighboring template etch stacks and on a surface of the neutral hard mask layer, the self-assembled block copolymer structure comprising an array of first phase separated polymeric domains and an array of second phase separated polymeric domains.

2. The method of claim 1 wherein the neutral hard mask layer is comprised of a nitrogen-doped silicon carbide, a nitrogen-doped hydrogenated silicon carbide, or combinations thereof.

3. The method of claim 1 wherein the BCPs comprise polystyrene and poly(methylmethacrylate).

4. The method of claim 1 wherein the organic planarization layer comprises spun on carbon.

5. The method of claim 1 wherein the thickness of the neutral hard mask layer is about 20 nm to about 60 nm.

6. The method of claim 1 wherein the forming of the self assembled block copolymer structure comprises spin coating a copolymer layer that contains self assembling block copolymers; and annealing the copolymer layer.

7. The method of claim 1 wherein each first phase separated polymeric domain of the array of first phase separated polymeric domains comprises poly(methylmethacrylate) and wherein each second phase separated polymeric domain of the array of second phase separated polymeric domains comprises polystyrene.

8. The method of claim 1 wherein the neutral hard mask layer and the recovery neutral hard mask coating are each independently comprised of is comprised of a nitrogen-doped silicon carbide, a nitrogen-doped hydrogenated silicon carbide, or combinations thereof; and wherein each of the neutral hard mask layer and the recovery neutral hard mask coating are formed by chemical vapor deposition (CVD).

9. The method of claim 1 wherein the neutrality recovery step comprises forming a recovery neutral hard mask coating on the neutral hard mask layer and the top portions of the plurality of template etch stacks, wherein the recovery neutral hard mask can comprise the same or different material from the neutral hard mask, wherein the recovery neutral hard mask is neutral to the BCPs.

10. The method of claim 9 wherein the recovery neutral hard mask coating is comprised of a nitrogen-doped silicon carbide, a nitrogen-doped hydrogenated silicon carbide, or combinations thereof.

11. The method of claim 9 wherein the recovery neutral hard mask coating that is formed has a thickness less than the thickness of the neutral hard mask layer.

12. The method of claim 1 wherein the step of forming a plurality of template etch stacks comprises an optical lithography step or a direct lithography step.

13. The method of claim 12 wherein the optical lithography step comprises extreme ultraviolet (EUV) lithography.

14. The method of claim 13 wherein the direct lithography step comprises e-beam lithography.

15. The method of claim 1 wherein the template etch stacks are formed by etching a tri-layer lithographic stack wherein the tri-layer lithographic stack comprises a resist layer.

16. The method of claim 15 wherein the resist layer comprises an e-beam resist or a photoresist.

17. The method of claim 15 wherein the tri-layer lithographic stack further comprises an optical planarization layer, and an antireflective coating layer.

18. The method of claim 17 wherein the optical planarization layer comprises amorphous carbon, spin-on carbon, an organic material including at least C, O, and H, or diamond-like carbon.

19. The method of claim 17 wherein the antireflective coating comprises a silicon-containing antireflective coating material.

* * * * *